(12) United States Patent
Cong et al.

(10) Patent No.: US 7,013,253 B1
(45) Date of Patent: Mar. 14, 2006

(54) METHOD AND APPARATUS FOR CALCULATION OF CROSSTALK NOISE IN INTEGRATED CIRCUITS

(75) Inventors: Jingsheng Jason Cong, Pacific Palisades, CA (US); Zhigang David Pan, White Plains, NY (US); Prasanna V. Srinivas, San Jose, CA (US)

(73) Assignee: Magma Design Automation, Inc., Cupertino, CA (US)

( * ) Notice: Subject to any disclaimer, the term of this patent is extended or adjusted under 35 U.S.C. 154(b) by 725 days.

(21) Appl. No.: 09/823,085

(22) Filed: Mar. 29, 2001

Related U.S. Application Data (60) Provisional application No. 60/194,240, filed on Apr. 3, 2000.

(51) Int. Cl.
*G06F 17/50* (2006.01)

(52) U.S. Cl. .............................. 703/14; 703/19; 716/4; 716/5

(58) Field of Classification Search ................ 716/4, 716/5, 8, 6; 703/14, 16, 13, 19; 704/215; 381/104
See application file for complete search history.

(56) References Cited

U.S. PATENT DOCUMENTS

| | | | |
|---|---|---|---|
| 5,446,674 A | 8/1995 | Ikeda et al. | |
| 5,535,133 A | 7/1996 | Petschauer et al. | |
| 5,555,506 A | 9/1996 | Petschauer et al. | |
| 5,568,395 A * | 10/1996 | Huang | 716/4 |
| 5,596,506 A | 1/1997 | Petschauer et al. | |
| 5,764,528 A | 6/1998 | Nakamura | |
| 5,825,661 A | 10/1998 | Drumm | |
| 5,838,581 A | 11/1998 | Kuroda | |
| 5,859,776 A | 1/1999 | Sato et al. | |
| 5,883,808 A | 3/1999 | Kawarabayashi | |
| 6,029,117 A | 2/2000 | Devgan | |
| 6,044,209 A | 3/2000 | Alpert et al. | |
| 6,117,182 A * | 9/2000 | Alpert et al. | 716/8 |
| 6,138,267 A | 10/2000 | Murai | |
| 6,493,853 B1 * | 12/2002 | Savithri et al. | 716/5 |
| 6,536,022 B1 * | 3/2003 | Aingaran et al. | 716/5 |
| 2002/0022951 A1 * | 2/2002 | Heijningen et al. | 703/16 |

OTHER PUBLICATIONS

Jin et al., "A new approach to analyze interconnect delays in RC wire models", IEEE, 1999.*
Kahng et al., "Noise models for multiple segmented RC interconnects", IEEE, Mar. 26-28, 2001.*
Rao, "Delay analysis of the distributed RC line", IEEE, 1995.*
Kawaguchi, H. et al.: "Delay and Noise Formulas for Capacitively Coupled Distributed RC lines", in Proc. Asia and South Pacific Design Automation Conf., pp. 35-43, 1998.
Nakagawa, S. et al.: "On-chip Cross Talk Noise Model for Deep-Submicrometer ULSI Interconnect", Hewlett-Packard Journal, vol. 49, pp. 39-45, Aug. 1998.

(Continued)

*Primary Examiner*—Leo Picard
(74) *Attorney, Agent, or Firm*—Blakely, Sokoloff, Taylor & Zafman LLP (57) ABSTRACT

A method and apparatus for identifying potential noise failures in an integrated circuit design is described. In one embodiment, the method comprises locating a victim net and an aggressor within the integrated circuit design, modeling the victim net using two $\pi$-type resistor-capacitor (RC) circuits, including determining a coupling between the victim net and the aggressor, and indicating that the integrated circuit design requires modification if modeling the victim net indicates that a potential noise failure may occur in the integrated circuit design.

16 Claims, 6 Drawing Sheets

OTHER PUBLICATIONS

Stöhr, T. et al.: "Analysis, Reduction and Avoidance of Crosstalk on VLSI Chips", in Proc. Int. Symp. On Physical Design, pp. 211-218, Apr. 1998.

Vittal, A. et al.: "Crosstalk Reduction for VLSI", IEEE Trans. On Computer-aided Design of Integrated Circuits and Systems, vol. 16, pp. 290-298, 1997.

Devgan, A. : "Efficient Coupled Noise Estimation for On-chip Interconnects", in Proc. IEEE/ACM Int. Conf. On Computer Aided Design, pp. 147-153, 1997.

Semiconductor Industry Association, "The National Technology Roadmap for Semiconductors", 1997 edition.

Shepard, K.L., et al.: "Noise in Deep Submicron Digital Design", in Proc. IEEE/ACM Int. Conf. On Computer Aided Design, pp. 524-531, 1996.

Sakurai, T.: "Closed-form Expressions for Interconnection Delay, Coupling, and Crosstalk in VLSIs", IEEE Trans. On Electron Devices, vol. 40, pp. 118-124, 1993.

* cited by examiner

METHOD AND APPARATUS FOR CALCULATION OF CROSSTALK NOISE IN INTEGRATED CIRCUITS

This application claims the benefit of U.S. Provisional Application No. 60/194,240 entitled "An Improved Crosstalk Model with Applications to Noise Constrained Interconnect Optimization," filed Apr. 3, 2000.

FIELD OF THE INVENTION

The invention is related to the field of integrated circuit (IC) design; more particularly, the present invention relates to a crosstalk noise model for on-chip noise analysis, control and minimization (to the extent possible) in deep sub-micron (DSM) and other IC designs.

BACKGROUND OF THE INVENTION

In DSM IC designs, the coupling capacitance between adjacent nets has become a dominant component as taller and narrower wires are placed closer to each other. The coupling capacitance not only leads to excessive signal delays, but also causes potential logic malfunctions. The problem with such malfunctions is serious for designs with higher clock frequencies, lower supply voltages, and usage of dynamic logic since they have lower noise margin.

To design noise immune integrated circuits, an accurate yet efficient crosstalk noise model is needed to guide layout optimization at various stages. A number of researchers have worked towards developing simple but reasonably accurate crosstalk noise models suitable for layout optimizations. By solving telegraph equations directly analytical formula for peak noise amplitude for capacitively coupled bus lines were obtained. See T. Sakurai, "Closed-form Expressions for Interconnection Delay, Coupling, and Crosstalk in VLSIs," *IEEE Trans. on Electron Devices*, vol. 40, pp. 118–124, 1993, and H. Kawaguchi and T. Sakurai, "Delay and Noise Formulas for Capacitively Coupled Distributed RC Lines," in *Proc. Asia and South Pacific Design Automation Conf.*, pp. 35–43, 1998. However, their approaches can only handle a fully coupled bus structure and cannot be used in general on-chip noise estimation for partially coupled line or general RC trees.

In A. Vittal & M. Marek-Sadowska, "Crosstalk Reduction for VLSI," *IEEE Trans. on Computer-Aided Design of Integrated Circuits and Systems*, vol. 16, pp. 290–98, 1997, each aggressor and victim net are modeled by an L-type RC circuit and a closed-form expression is obtained for both peak noise upper bound and noise-over-time integral. It showed much improvement on the pure charge sharing model. However, the modeling assumed a step input for the aggressor net. Subsequently, this model was extended to consider a saturated ramp input or a Pi-type lumped RC circuit. See S. Nakagawa, D. M. Sylvester, J. McBride, & S. -Y. Oh, "On-chip Cross Talk Noise Model for Deep-submicrometer ULSI Interconnect," *Hewlett-Packard Journal*, vol. 49, pp. 39–45, August 1998.

In T. Stohr, M. Alt, A. Hetzel, and J. Koehl, "Analysis, Reduction and Avoidance of Crosstalk on VLSI Chips," *Proc. Int. Symp. on Physical Design*, pp. 211–18, April 1998, an empirical pattern-based noise metric is obtained by using different coupling factors for different geometric and circuitry patterns. One problem with this approach is that the coupling factor is very much technology dependent.

Most of the models discussed above do not consider the distributed nature of an RC network, which is needed in DSM designs.

In A. Devgan, "Efficient Coupled Noise Estimation for On-chip Interconnects," in *Proc. Int. Conf. on Computer Aided Design*, pp. 147–153, 1997, an Elmore-delay like peak noise model was disclosed for general RC trees in the manner exactly like the Elmore delay, which guarantees to be an upper bound. However, the model assumed an infinite (non-saturated) ramp input. Therefore, it tends to overestimate the peak noise, especially for large victim nets, and small aggressor slews, which are very likely in DSM. In fact, the peak noise obtained from this model could even be larger than the supply voltage. Recent work in A. Vittal, L. Chen, M. Marek-Sadowska, K. -P. Wang, and S. Yang, "Crosstalk in VLSI Interconnections," in *IEEE Trans. on Computer-Aided Design of Integrated Circuits and Systems*, vol. 18, no. 2, pp. 1817–24, 1999, was shown to handle distributed networks and saturated ramp input. Even so, their model often gives larger errors when the aggressor slew is relatively large and leads to 100% over estimation compared to the Devgan model referred to above.

Thus, most previous crosstalk models used either oversimplified lumped RC model or unrealistic assumption (e.g., infinite ramp voltage input for aggressor net). Thus, they either underestimate or overestimate peak crosstalk noise significantly. In addition, most of these models only focused on the peak noise, while ignoring the crosstalk noise width modeling.

SUMMARY OF THE INVENTION

A method and apparatus for identifying potential noise failures in an integrated circuit design is described. In one embodiment, the method comprises locating a victim net and an aggressor within the integrated circuit design, modeling the victim net using two π-type resistor-capacitor (RC) circuits, including determining a coupling between the victim net and the aggressor, and indicating that the integrated circuit design requires modification if modeling the victim net indicates that a potential noise failure may occur in the integrated circuit design.

BRIEF DESCRIPTION OF DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

A method and apparatus for crosstalk modeling of integrated circuits (ICs) and subsequent optimization of the same. In the following description, numerous details are set forth in order to provide a thorough understanding of the present invention. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

Overview

A crosstalk noise model, referred to as the 2-$\pi$ model, is described that includes both peak noise and noise width modeling. In one embodiment, the crosstalk noise model is suitable to guide noise-aware layout design and interconnect optimization. The model takes into consideration of many important parameters, such as, for example, the aggressor slew at the coupling location, the coupling location of the victim net (e.g., near-driver or near-receiver), and the coarse distributed RC characteristics for a victim net (e.g., downstream/upstream interconnect resistance/capacitance, etc.). Thus, the crosstalk model is much more accurate than models described herein as being in the prior art, with less than 6% error on average compared with HSPICE simulations.

Moreover, the model enjoys simple closed-form expressions for both peak noise amplitude and noise width and provides clear physical meaning for key noise contribution terms such as, for example, coupling capacitance. The closed-form nature of the model provides quantitative insights to guide interconnect optimization for noise reduction. In fact, these characteristics enable the crosstalk model to guide noise-aware layout optimizations. That is, due to its high accuracy and closed-form nature, the noise model can be used to derive a set of noise-reduction rules in a DSM noise-aware CAD tool. For example, it can be used to evaluate the impact of the choice of different geometric or circuit parameters to meet certain noise constraint and/or to directly guide any noise-constrained layout/interconnect optimization and tools, such as wire ordering and spacing tools or detailed routing tools for noise control or reduction.

Thus, the crosstalk model described herein provides for crosstalk noise modeling during layout optimization. One or several benefits listed below are the products of the model described herein: (a) more efficient and more accurate noise-aware interconnect design and optimization tools, (b) better control of trade-off between different noise-reduction techniques, (c) smaller layout area and/or better performance due to less overdesign for noise immunity, and (d) less iteration and shorter design time due to the high accuracy and efficiency of the model.

Overview of the IC Design Process

The method and apparatus described herein improve the process of designing an integrated circuit by providing a computer system and associated method to automatically layout and route post-layout optimization circuitry. Those skilled in the art will appreciate that the present invention applies equally to any computer-based process for designing integrated circuits.

Figure 1A:
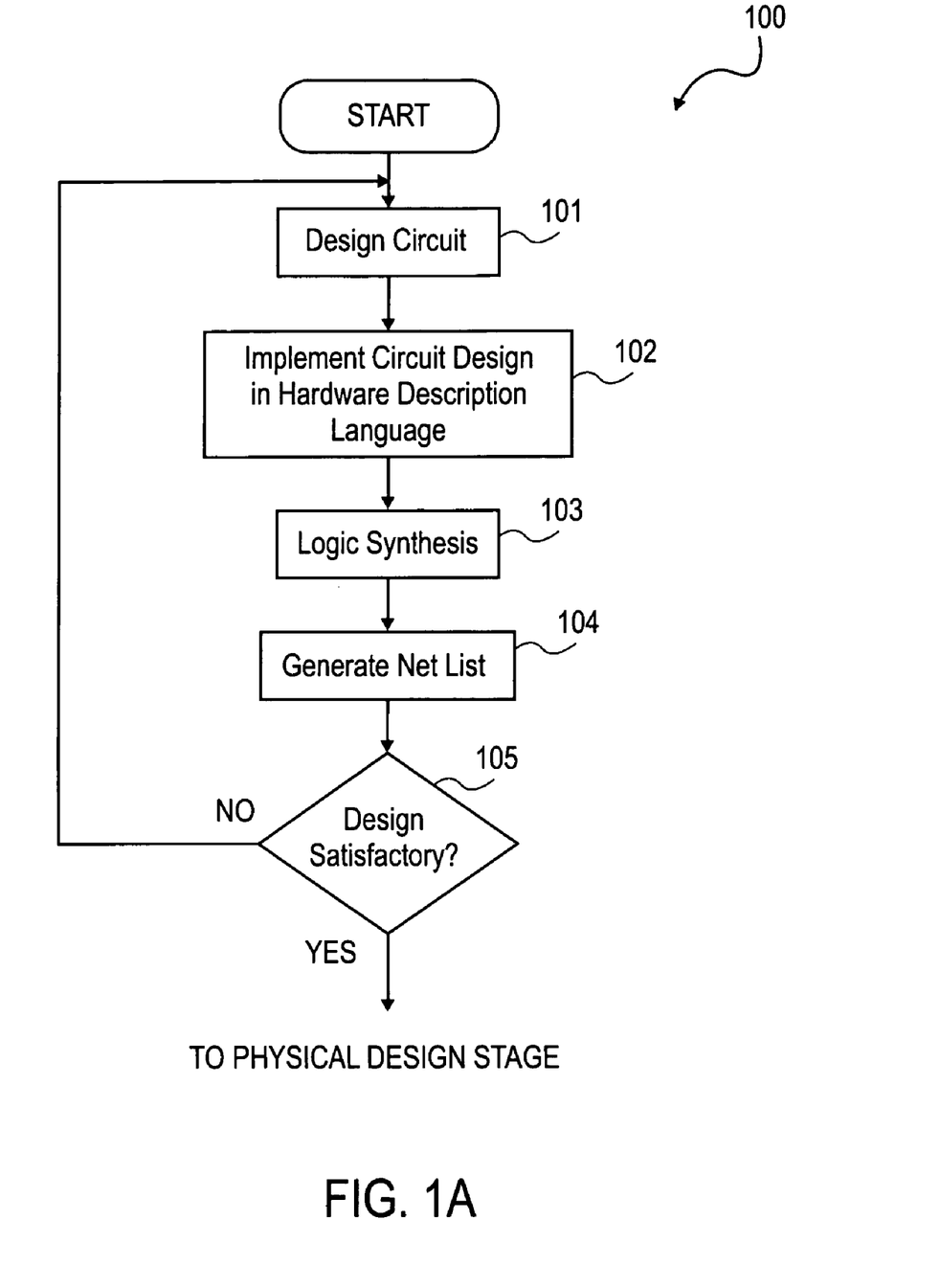
FIG. 1A is a flow diagram of the logic design stage.

Many different computer-based design tools exist for designing integrated circuits. Design tools typically operate in two distinct stages, the logic design stage, followed by the physical design stage. FIG. 1A is a flow diagram of the logic design stage. The operations in the logic design stage may be performed by processing logic in a design tool that comprises hardware, software or a combination of both. Referring to FIG. 1A, the logic design stage for one particular type of computer-based integrated circuit design tool begins with designing the circuit (processing block 101). Once the circuit is designed, processing logic implements the circuit design in a suitable hardware description language (processing block 102), such as, for example, VHDL or Verilog. Next, processing logic performs logic synthesis (processing block 103), which, among other things, estimates the timing for each net in the circuit based on the number and type of circuit elements connected to the net. Once the logic synthesis is complete, processing logic generates a net list (processing block 104), which represents a detailed listing of all circuit elements and their interconnections to implement the circuit design. Processing logic determines whether the performance of the circuit during logic synthesis indicates that the design will not work as desired (processing block 105). If not, then processing logic transitions to processing block 102 and the logic design stage is repeated. If the performance is satisfactory, processing logic proceeds the design tool then proceeds to the physical design stage.

Figure 1B:
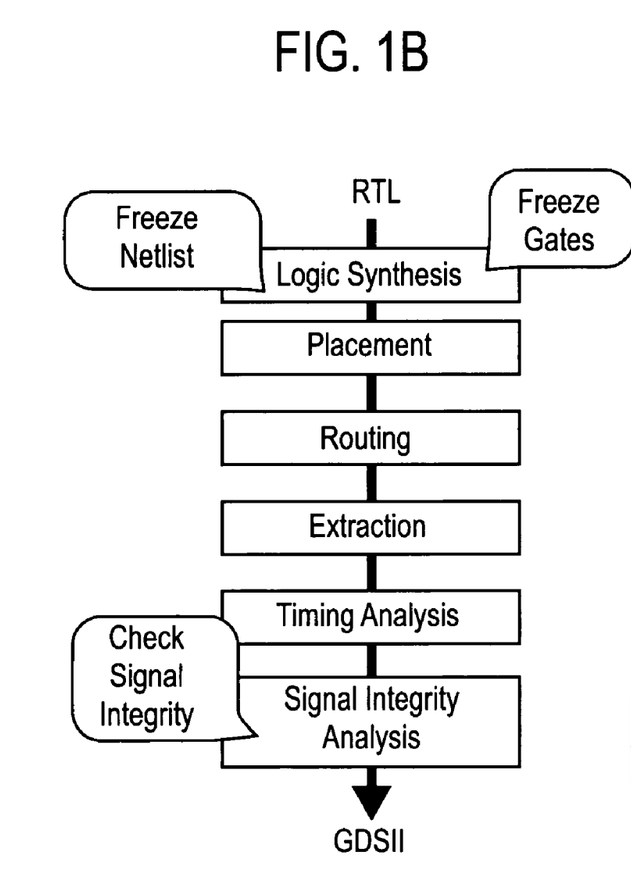
FIG. 1B illustrates one embodiment of the IC design flow.

In one embodiment, the physical design phase may comprise the following processes, in order: placement, routing, extraction, timing analysis, and signal integrity analysis. FIG. 1B illustrates one embodiment of the IC design flow. The synthesis process attempts to optimize gates before actual wire loading is known. Based on estimated wire loads, synthesis freezes the gates and the netlist, sending both to the place & route phases for layout. The place & route processes attempt to optimize the IC design for die size while trying to meet timing constraints specified for the design. Signal integrity is performed post-layout to locate over-driven wires in the design that occur adjacent to weaker wires, thereby causing crosstalk noise problems. An individual manually fixes these problems.

Figure 1C:
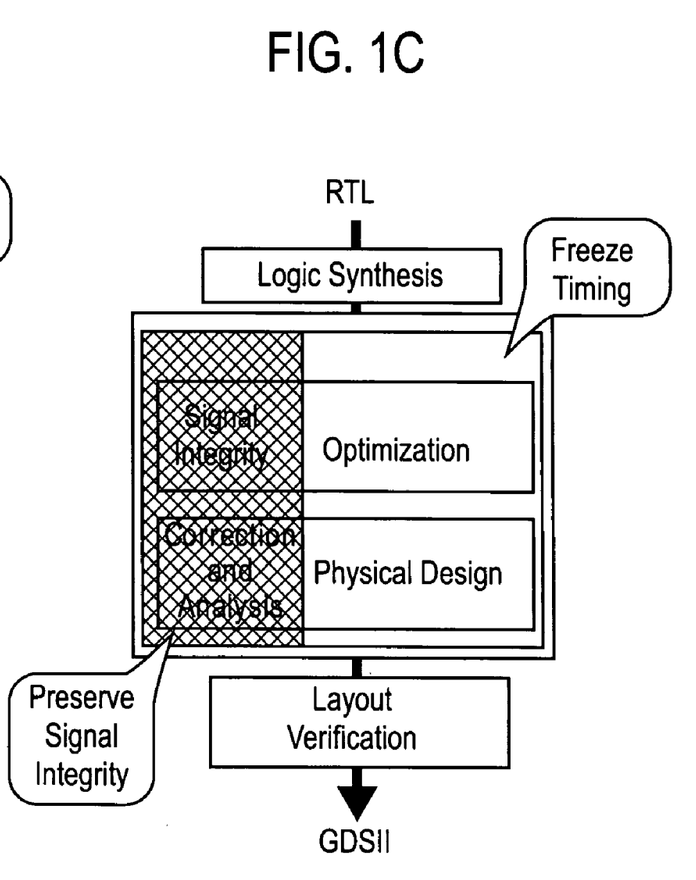
FIG. 1C is a flow diagram of an alternative embodiment of the design flow process.

In an alternative embodiment, processing logic performs timing optimization to achieve the best timing, or at least some prespecified timing, and then the timing is frozen. Subsequent to freezing the timing, processing logic optimizes the gates and logic structure to meet that timing. The timing is held constant during the physical design phase while the design undergoes correction and analysis to optimize it for signal integrity. Thus, processing logic selects the size of the gates optimally for the actual wire load. In so doing, crosstalk issues may be avoided during physical implementation. FIG. 1C is a flow diagram of such a process.

Figure 2A:
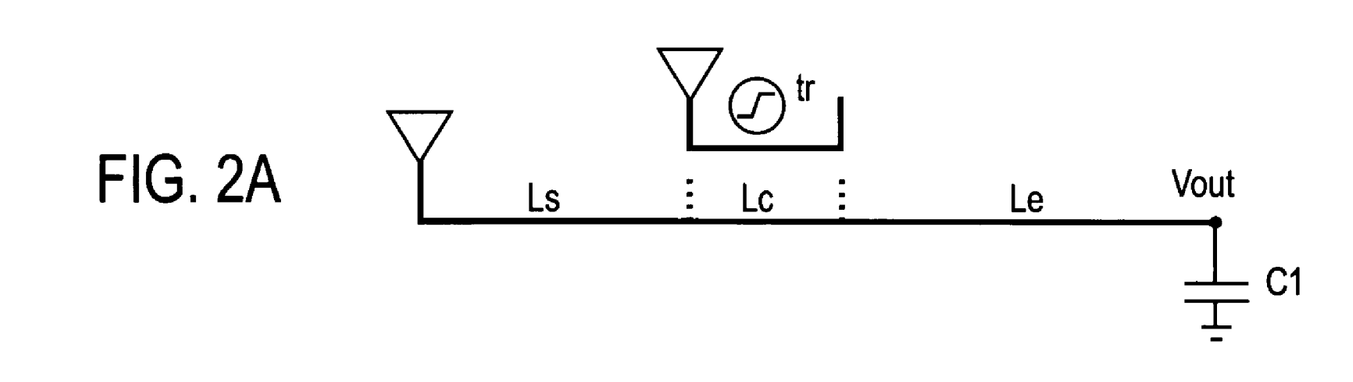
FIG. 2A illustrates a victim net with an aggressor nearby.
Figure 2B:
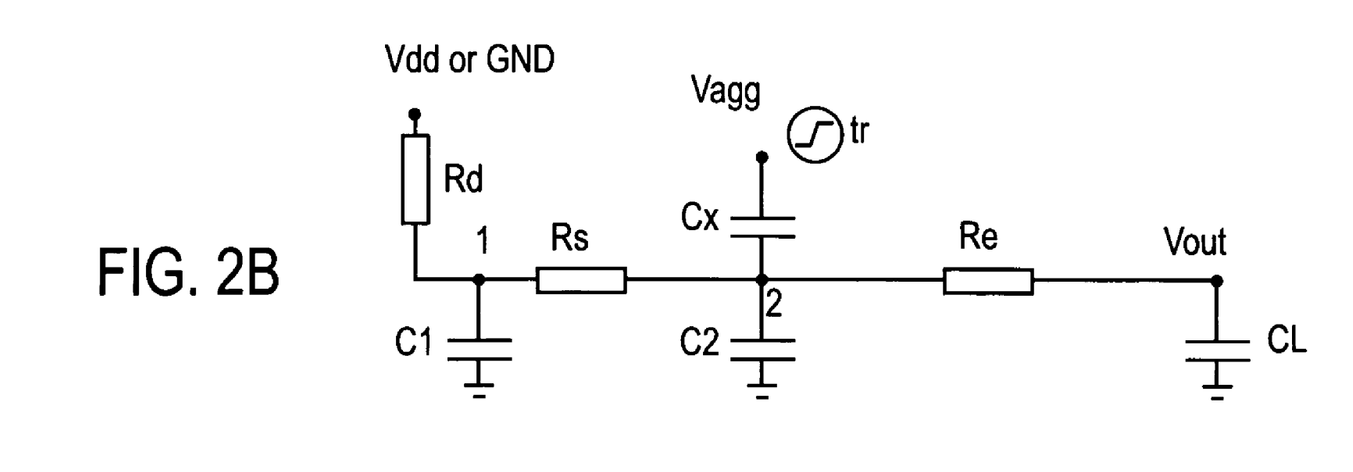
FIG. 2B illustrates one embodiment of the crosstalk noise model.

In either process, the 2-π model crosstalk model is used. For simplicity, an explanation of the crosstalk model is given for the case where the victim net is a RC line. The model is extended to RC tree in more detail below. FIG. 2A illustrates a victim net with some aggressor nearby. The aggressor's voltage pulse at the coupling location is a saturated ramp voltage input with transition time (i.e., slew) being $t_r$, and the interconnect length of the victim net before the coupling, at the coupling and after the coupling be $L_s$, $L_c$ and $L_e$, respectively. Based on the layout, a reduced RC model may be obtain and is shown in FIG. 2B to compute the crosstalk noise. The 2-π model models the victim net as two π-type RC circuits, one before the coupling and one after the coupling. The victim driver is modeled by effective resistance $R_d$. Other RC parameters $C_x$, $C_1$, $R_s$, $C_2$, $R_e$, and $C_L$ are computed from the geometric information in the layout of FIG. 2A in the following manner. The coupling node (node 2) is set to be the center of the coupling portion of the victim net, i.e., of distance $L_s+L_c/2$ from the source. The upstream and downstream interconnect resistance/capacitance at node 2 are $R_s/C_s$ and $R_e/C_e$, respectively. The capacitance values are set to be $C_1=C_s/2$, $C_2=(C_s+C_e)/2$ and $C_L=C_e/2+C_1$. As opposed to the prior art that only used one lumped RC for the victim net, the 2-π model can model the coarse distributed RC characteristics. As only the key parameters are considered, the resulting 2-π model can be solved analytically.

From FIG. 2B, the impedance at node 1, $Z_1$, satisfies the following:

$$\frac{1}{Z_1} = \frac{1}{R_d} + sC_1.$$

Then at node 2, the impedance $Z_2$ satisfies the following:

$$\frac{1}{Z_2} = \frac{1}{(Z+R_s)} + sC_2 + \frac{1}{R_e + \frac{1}{sC_L}}$$

Denoting the s-domain voltage at node 2 by $V_2(s)$ results in the following equation:

$$V_2(s) = \frac{Z_2}{Z_2 + \left(\frac{1}{sC_2}\right)} \cdot V_{agg}(s)$$

Therefore, the output voltage $V_{out}$ in the s-domain is $$V_{out}(s) = V_2(s) \cdot \frac{\frac{1}{sC_L}}{R_e + \frac{1}{sC_L}} \quad (1)$$

Substituting $Z_1$, $Z_2$ and $V_2$ into $V_{out}$ results in the following:

$$V_{out}(s) = \quad (2)$$

$$\frac{Z_2}{Z_2 + \left(\frac{1}{sC_2}\right)} \cdot \frac{\frac{1}{sC_L}}{R_e + \frac{1}{sC_L}} \cdot V_{agg}(s) = \frac{a_2 s^2 + a_1 s}{s^3 + b_2 s^2 + b_1 s + b_0} \cdot V_{agg}(s)$$

where the coefficients are $a_2 = K_1/K_2$ $a_1 = (R_d+R_s)C_x/K_2$ $b_2 = ((C_2+C_x) \cdot (R_e C_L(R_d+R_s)+R_d R_s C_1)+R_d R_e C_1 C_L+C_L \cdot R_d R_s C_1)/K_2$ $b_1 = ((R_d+R_s)(C_x+C_2+C_L)+(R_e C_L+R_d C_1))/K_2$ $b_0 = 1/K_2$ $K_1 = C_x R_d R_s C_1$ $K_2 = R_d R_s C_1 C_L R_e (C_x+C_2)$ Writing the transform function H(s) into the pole/residue form results in the following equation:

$$\frac{a_2 s^2 + a_1 s + a_0}{s^3 + b_2 s^2 + b_1 s + b_0} \equiv \frac{k_1}{s-s_1} + \frac{k_2}{s-s_2} + \frac{k_3}{s-s_3}.$$

The three poles $S_1$, $S_2$, and $S_3$ are the three roots of $s^3+b_2s^2+b_1s+b_0=0$. Let $s \equiv y-b_2/3$, then the pole equation can be rewritten as $$y^3+py+q=0 \qquad (3)$$

where $p=-b_2^2/3+b_1$, and $q=2b_2^3/27-b_1b_2/3+b_0$. The three roots for Eqn. (3) are $$y_1=2r^{1/3}\cos\theta$$

$$y_2=2r^{1/3}\cos(\theta+2\pi/3)$$

$$y_3=2r^{1/3}\cos(\theta+4\pi/3)$$

where $r=(p/3)^{2/3}$, and $$\theta = \frac{1}{3}\mathrm{acos}(-q/2r).$$

Then the poles $s_1$, $s_2$, and $s_3$ can be obtained from $s_i=y_i-b_2/3$ (i=1, 2, 3). The three residues $k_1$, $k_2$ and $k_3$ can be obtained by solving the following linear equation array.

$$a_2=k_1+k_2+k_3$$

$$a_1=-(s_2+s_3)k_1-(s_1+s_3)k_2-(s_1+s_2)k_3$$

$$a_0=s_2s_3k_1+s_3s_1k_2+s_1s_2k_3$$

After obtaining each pole/residue pair, its corresponding time domain function is given by the following equation:

$$f_i(t)=k_i e^{s_i t}(i=1, 2, 3).$$

For the aggressor with saturated ramp input with normalized $V_{dd}=1$ and the transition time $t_r$, i.e., $$v_{agg}(t) = \begin{cases} t/t_r & 0 \le t \le t_r \\ 1 & t > t_r \end{cases}$$

its Laplace transformation is given by the following equation:

$$V_{agg}(s) = \frac{1-e^{-st_r}}{s^2 t_r}. \qquad (4)$$

Then for each pole/residue pair, the s-domain output $$V_{out_1}(s) = \frac{k_j}{s-s_i} \cdot V_{agg}(s),$$

and its inverse Laplace is the convolution of $f_1(t)$ and $g(t)$, $$v_{out_i}(t) = f_i(t)*g(t) = \int_0^t f_i(t-u)g(u)du \qquad (5)$$

$$= \begin{cases} -\frac{k_i(1+s_i t)}{s_i^2 t_r} + \frac{k_i e^{s_i t}}{s_i^2 t_r} & 0 \le t \le t_r \\ -\frac{k_i e^{s_i(t-t_r)}}{s_i^2 t_r} + \frac{k_i e^{s_i t}}{s_i^2 t_r} - \frac{k_i}{s_i} & t > t_r \end{cases}$$

Therefore, the final noise voltage waveform is the summation of the voltage waveform from each poles/residue pair.

$$v_{out}(t)=v_{out_1}(t)+v_{out_2}(t)+v_{out_3}(t) \qquad (6)$$

As for time complexity, since the closed-form expressions for the poles, residues, and waveform for each pole/residue pair are available, the computation time for the transfer function and waveform of a given 2-π model is done in constant time. To reduce the original circuit to the 2-π model, a linear traversal is performed (to compute upstream/downstream interconnect resistance/capacitance at the coupling node) of the victim net, which can be done in linear time.

Closed-Form Noise Amplitude and Width

Although the closed-form noise waveform solution is derived above, the solution by itself still appears to be complicated and provides little intuition about some key measurements for crosstalk noise, such as noise peak amplitude and noise width, which are important to guide noise reduction by interconnect optimization. Moreover, it cannot directly give the closed-form peak noise and noise width to be discussed in detail below.

For stable RC circuits with poles $0>s_1>s_2>s_3 \ldots$, the dominant pole $s_1$ is the one that is closest to zero. For RC circuits, there is usually a very dominant pole which catches the most important information, followed by the second pole with considerable distance and so on. This may be depicted as $0>s_1>>S_2>>S_3>> \ldots$ Using dominant-pole approximation in a similar manner to the prior art described above, equation (2) above is simplified as follows:

$$V_{out}(s) \approx \frac{st_x}{st_v+1} \cdot V_{agg}(s) = \frac{t_x(1-e^{-st_r})}{st_r(st_v+1)} \qquad (7)$$

where the coefficients are $$t_x=(R_d+R_s)C_x$$

$$t_v=(R_d+R_s)(C_x+C_2+C_L)+(R_e C_L+R_d C_1).$$

The value $t_x$ is the RC delay term from the upstream resistance of the coupling element times the coupling capacitance, while $t_v$ is the distributed Elmore delay of a viction net.

Computing the inverse Laplace transform of equation (7) above results in the following time domain waveform:

$$v_{out}(t) = \begin{cases} \frac{t_x}{t_r}(1-e^{-t/t_r}) & 0 \le t \le t_r \\ \frac{t_x}{t_r}(e^{(-(t-t_r)/t_r}-e^{-t/t_v}) & t > t_r \end{cases} \qquad (10)$$

From the above noise expression it is clear that $v_{out}$ monotonically increases at $0 \le t \le t_r$, and monotonically decrease at $t>t_r$. Therefore, the peak noise will be at $t=t_r$, with the value of:

$$v_{max} = \frac{t_x}{t_r}(1 - e^{-t_r/t_v}). \quad (11)$$

The $v_{max}$ in equation (11) has the following upper bound:

$$v_{max} \leq \frac{(R_d + R_s)C_x}{t_r} \cdot \frac{t_r}{t_v} \quad (12)$$

$$= \frac{(R_d + R_s)C_x}{R_d(C_1 + C_x + C_2 + C_L) + R_s(C_x + C_2 + C_L) + R_e C_L}$$

Peak noise amplitude $v_{max}$ is not the only metric to characterize noise. Under some circumstances, even when the peak noise exceeds certain threshold voltage, a receiver may still be noise-immune. This can be characterized by some noise amplitude versus width plots.

Figure 3:
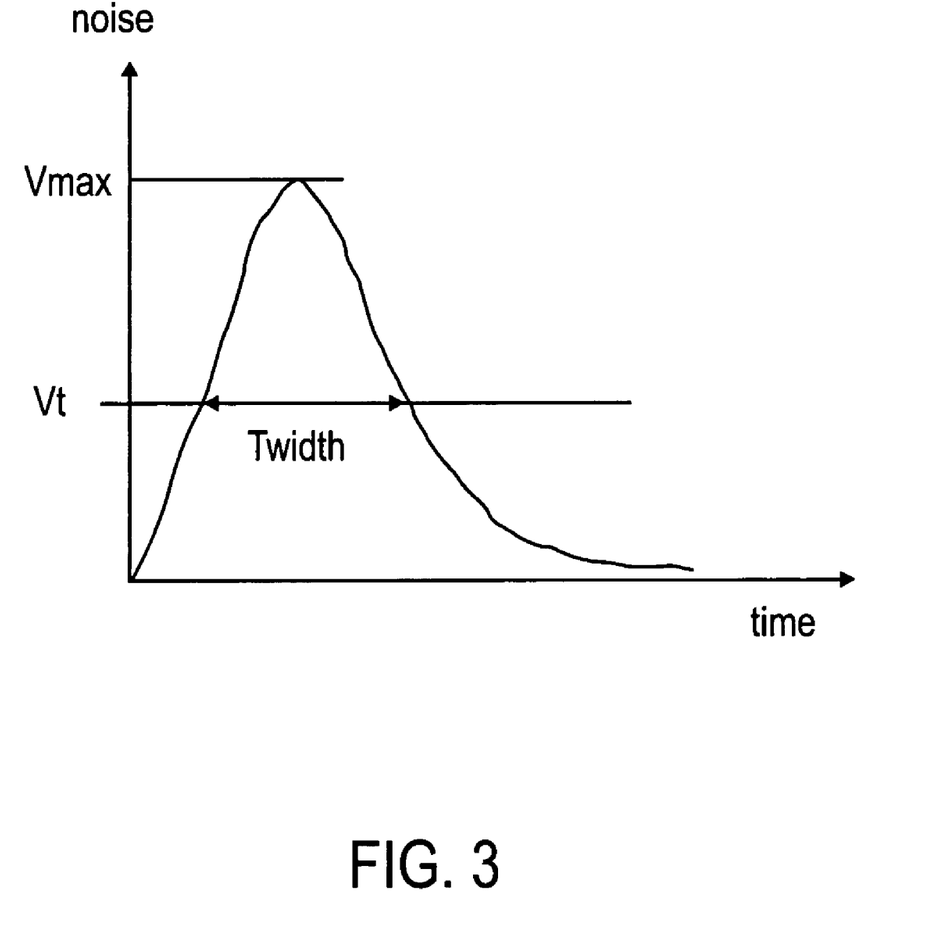
FIG. 3 illustrates noise width.

The noise width is defined as follows and illustrated in FIG. 3. Given a certain threshold voltage level $v_t$, the noise width for a noise pulse is defined to be the length of the time interval that the noise spike voltage v is greater than or equal to $v_t$.

The one dominant pole approximation of $t_v$ given above is used to estimate noise width. From Eqn. (10), the noise width can be obtained in the following formula:

$$t_2 - t_1 = t_v \ln\left[\frac{(t_x - t_r v_t)(e^{t_r/t_v} - 1)}{t_r v_t}\right] \quad (13)$$

Although other threshold voltages may be used, in one embodiment, the threshold voltage $v_t$ is set to be half of the peak noise voltage, $v_t=v_{max}/2$. Then, the noise width is simplified into:

$$t_{width} = t_2 - t_1 = t_r + t_v \ln\left[\frac{1 - e^{-2t_r/t_v}}{1 - e^{-t_r/t_v}}\right] \quad (14)$$

Extension to RC Trees

Figure 4:
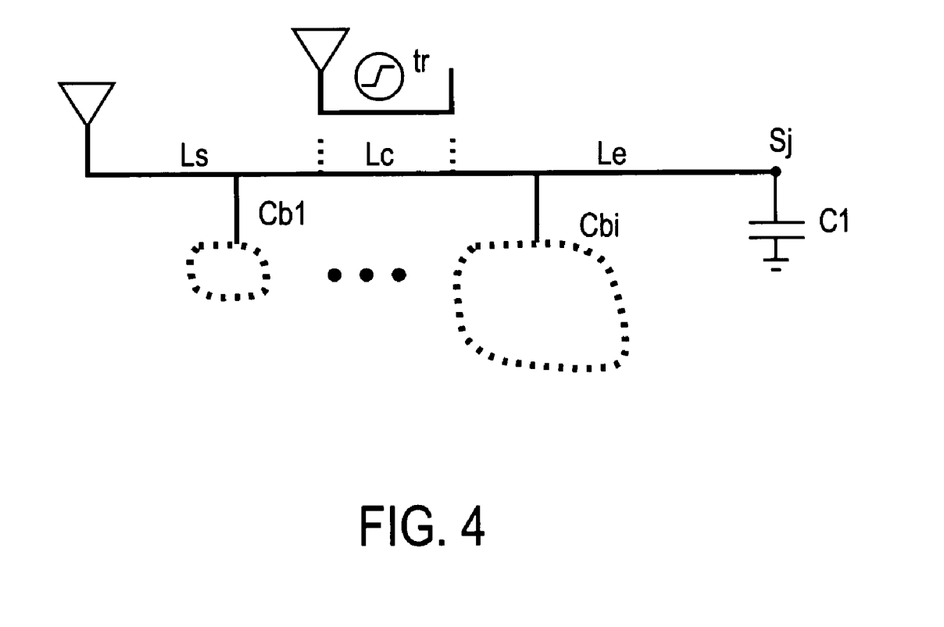
FIG. 4 is an alternative crosstalk model.

The 2-π model can be extended to a victim net in general RC tree structures. To compute the crosstalk noise at a certain sink (receiver) $S_J$, the corresponding 2-π model in FIG. 4 is used, which is similar to that in FIG. 2A. The upstream and downstream resistance computation remains the same with the only difference being that the lumped capacitance at each branch is incorporated on the path from source to $S_J$, i.e., $C_{b1}, \ldots C_{b1}$. The $C_{bi}$'s are added into $C_1$, $C_2$ or $C_L$ in a weighted manner according to their locations in the following manner. If a branch $B_1$ is between the source and the coupling center, then let its distance to the source be $\alpha(L_s+L_c/2)$, thereby causing $(1-\alpha)C_{bi}$ to go to $C_1$ and $\alpha C_{bi}$ to go to $C_2$. If a branch $B_1$ is between the sink and the coupling center, let its distance to the sink be $\beta(L_e+L_c/2)$, thereby causing $(1-\beta)C_{b1}$ to go to $C_L$ and $\beta C_{b1}$ to go to $C_2$.

It can easily be shown that in the resulting 2-π model of multiple-pin nets, $t_x$ is the same as that in 2-pin nets, while $t_v$ is still the Elmore delay from the source to sink $S_J$, but now with branching capacitances. The analytical solution of the 2-π model remains the same. For a coupling element (e.g., $C_x$) not on the path from the source to sink $S_J$ (i.e., coupling with some branching elements), the computation $t_x$ only takes $C_x$'s upstream resistance common to the path from the source to sink $S_J$ (in the same principle as the Elmore delay computation).

Experimental results show that the 2-π model works very well for both 2-pin nets and multiple-pin nets of general routing-tree structures, with average error for peak noise and noise width of only 4.3% and 5.89%.

To summarize, compared to well-known previous models, the model has much more accuracy and has the same computational complexity.

Optimization Rules for Noise Reduction

The following description provides a set of optimization rules for noise reduction. Once such optimization is the use of buffer insertion to reduce noise, which is well-known in the art. Specifically, the 2-π model may be used as an internal noise evaluator to guide buffer insertion. No further discussion on buffer insertion is necessary. The focus below is on a direct-connected net.

For ease of reference, the peak noise and noise width closed-form formulas are rewritten as follows:

$$v_{max} = \frac{t_x}{t_r}(1 - e^{-t_r/t_v}) \quad (15)$$

$$t_{width} = t_r + t_v \ln\left[\frac{1 - e^{-2t_r/t_v}}{1 - e^{-t_r/t_v}}\right] \quad (16)$$

where $t_x=(R_d+R_s)C_x$ and $t_v=(R_d+R_s)(C_x+C_2+C_L)+(R_eC_L+R_dC_1)$. In one embodiment, since the noise pulse being below a certain threshold voltage ($v_{th}$) will not cause a receiver to malfunction, the peak noise $v_{max}$ reduction is the avenue for further noise reduction derived using the 2-π model presented herein. However, the noise width is considered when the peak noise exceeds the threshold voltage as described above.

Driver Sizing

Intuitively, driver sizing can help to reduce the peak crosstalk noise since a stronger driver has more capability to sustain a noise spike. Although this is true in most cases, the 2-π model does indicate some situations under which increasing driver size (i.e., reducing $R_d$) may not help to reduce the peak noise. Consider $$\frac{\partial v_{max}}{\partial R_d} = \frac{C_x}{t_r}\left[1 - \frac{(R_d+R_s)(C_1+C_2+C_x+C_L)}{t_v} \cdot \frac{t_r}{t_v}}{e^{t_r/t_v}}\right].$$

If $(R_d+R_s)(C_1+C_2+C_x+C_L) \leq t_v$ (i.e., $R_sC_1<R_eC_L$ after substituting $t_v$), then $$\frac{\partial v_{max}}{\partial R_d} > 0$$

and sizing up a driver will reduce noise. However, if $(R_d+R_s)(C_1+C_2+C_x+C_L)>t_v$ (i.e., $R_sC_1>R_eC_L$) and $t_r<<t_v$, one may have the situation that $$\frac{\partial v_{max}}{\partial R_d} \leq 0.$$

Consider the extreme case of tr→0, then the peak noise is $$\frac{C_x \cdot R_d + R_s C_x}{(C_1 + C_x + C_2 + C_L) \cdot R_d + R_s(C_x + C_2 + C_L) + R_e C_L} \quad \text{If}$$

$$k_1 = \frac{C_x}{C_1 + C_x + C_2 + C_L} \text{ and } k_2 = \frac{C_x}{R_s(C_x + C_2 + C_L) + R_e C_L},$$

then is easy to verify that if $k_1 > k_2$ (i.e., $R_s C_1 < R_e C_1$), $$\frac{\partial v_{max}}{\partial R_d} > 0,$$

while if $k_1 < k_2$, $$\frac{\partial v_{max}}{\partial R_d} < 0.$$

$v_{max}$ is bounded by $k_1$ and $k_2$, i.e., $\min(k_1, k_2) \leq v_{max} \leq \max(k_1, k_2)$. That is, no matter how one optimally sizes a driver, there is still some noise lower bound, and performing driver sizing may not help to reduce the peak noise below the desired level.

In summary, if $R_s C_1 < R_e C_L$, then sizing up the victim driver strength (i.e., reduce effective $R_d$) reduces peak noise. However, if $R_s C_1 > R_e C_L$ and $t_r << t_v$, then driver sizing will not help to reduce peak noise. In either situation, there is a certain lower bound for peak noise that can be achieved by doing driver sizing only. Thus, by using the crosstalk model, a determination may be made as to whether or not to use driver sizing.

Near-Driver versus Near-Receiver Coupling

The following discusses the effects of different coupling locations on peak noise and the use of the 2-π model. From $$v_{max} = \frac{(R_d + R_s)C_x}{t_r}(1 - e^{-t_r/t_v}),$$

it is known that as the coupling element moves toward the receiver, $R_s$ increases. Meanwhile, the Elmore delay $t_v$ increases because more "lumped" capacitance is now near the receiver, but the increase rate is much less than that of $R_s$ and the overall effect to the peak noise is determined by the increase of $R_s$. This proposition is validated through extensive simulations. Thus, during topology generation/routing of a noise-sensitive victim net, one should avoid near-receiver coupling, especially to its strong aggressors.

Shield Insertion

Shielding (non-aggressive) wires may be inserted close to noise-sensitive receiver to avoid near-receiver coupling. A shielding wire also reduces peak noise by increasing "lumped" capacitance of the victim net. The peak noise monotonically decreases as $C_1$, $C_2$, or $C_L$ increases. For the same amount of capacitance increase, it is most effective at $C_L$, and least effective at $C_1$. i.e., $$\frac{\partial v_{max}}{\partial C_L} < \frac{\partial v_{max}}{\partial C_2} < \frac{\partial v_{max}}{\partial C_1} < 0$$

Therefore, to reduce crosstalk noise, neighbors (shields) should be placed or inserted around a victim net's receiver.

Wire Spacing versus Sizing

The peak noise monotonically increases as $C_x$ increases, i.e., $\partial v_{max}/\partial C_x > 0$. Monotone Capacitance Model refers to the fact that for a wire segment with fixed width, its coupling capacitance monotonically increases while its ground capacitance monotonically decreases as its spacing to neighboring wire decreases. The peak noise monotonically decreases as wire spacing increases under the Monotone Capacitance Model.

Extensive capacitance extraction shows that Monotone Capacitance Model usually holds for DSM designs, thus wire spacing is an effective way to reduce noise (especially when other methods reach their limitations, e.g., driver sizing). The penalty is on the area side. For a given area constraint, however, wire spacing is consistently more effective than wire sizing for noise reduction. Thus, wire spacing is always an effective way to reduce noise, with an area penalty. For a given area constraint, wire spacing is usually more effective than wire sizing for crosstalk noise reduction.

On Noise Amplitude-Width Product

Under certain circumstances, a receiver may still be noise-immune even the peak noise exceeds a certain threshold voltage. This can be characterized by some noise amplitude versus width plots, which can then be transformed into an amplitude (A) versus amplitude-width (AW) product (A-AW plot). From equations (11) and (14), the AW product can be written as $$AW = (R_d + R_s)C_x \cdot f(x) \tag{17}$$

where $$f(x) = \frac{1 - e^{-x}}{x} \ln \frac{e^x - e^{-x}}{1 - e^{-x}} \text{ and } x = t_r/t_v.$$

It can verified that $f(x) \in [\ln 2, 1]$ (i.e., [0.69, 1)). This property suggests that AW is essentially determined by $(R_d + R_s)C_x$. Although techniques like increasing $C_1$, $C_2$ or $C_L$ (e.g., shield insertion) can reduce AW, they cannot go below the lower bound $\ln 2 \cdot (R_d + R_s)C_x$. The most effective way to reduce AW is to reduce $C_x$ (e.g., by spacing), Rd (by driver sizing), and $R_x$ (by wire sizing).

Thus, the noise amplitude-width product has a lower bound of $\ln 2(R_d + R_s)C_x$, and an upper bound of $(R_d + R_s)C_x$, which other parameters such as, for example, $C_1$, $C_2$, $R_e$, $C_L$ only play a minor role in it. The effective ways to reduce AW are wire spacing, driver sizing and wire sizing.

Thus, a much improved, closed form crosstalk noise model has been described. The crosstalk model has on average less than 6% error compared with HSPICE simulation for both peak noise voltage and noise width estimations. Compared to existing prior art models with similar complexity, the 2-π model has much better accuracy and it provides a unified view for them. The 2-π model may be used to develop a set of interconnect optimization rules to guide noise-aware interconnect optimizations, including driver sizing, topology construction, shield insertion and wire spacing versus sizing to reduce peak noise.

An Exemplary Computer System

Figure 5:
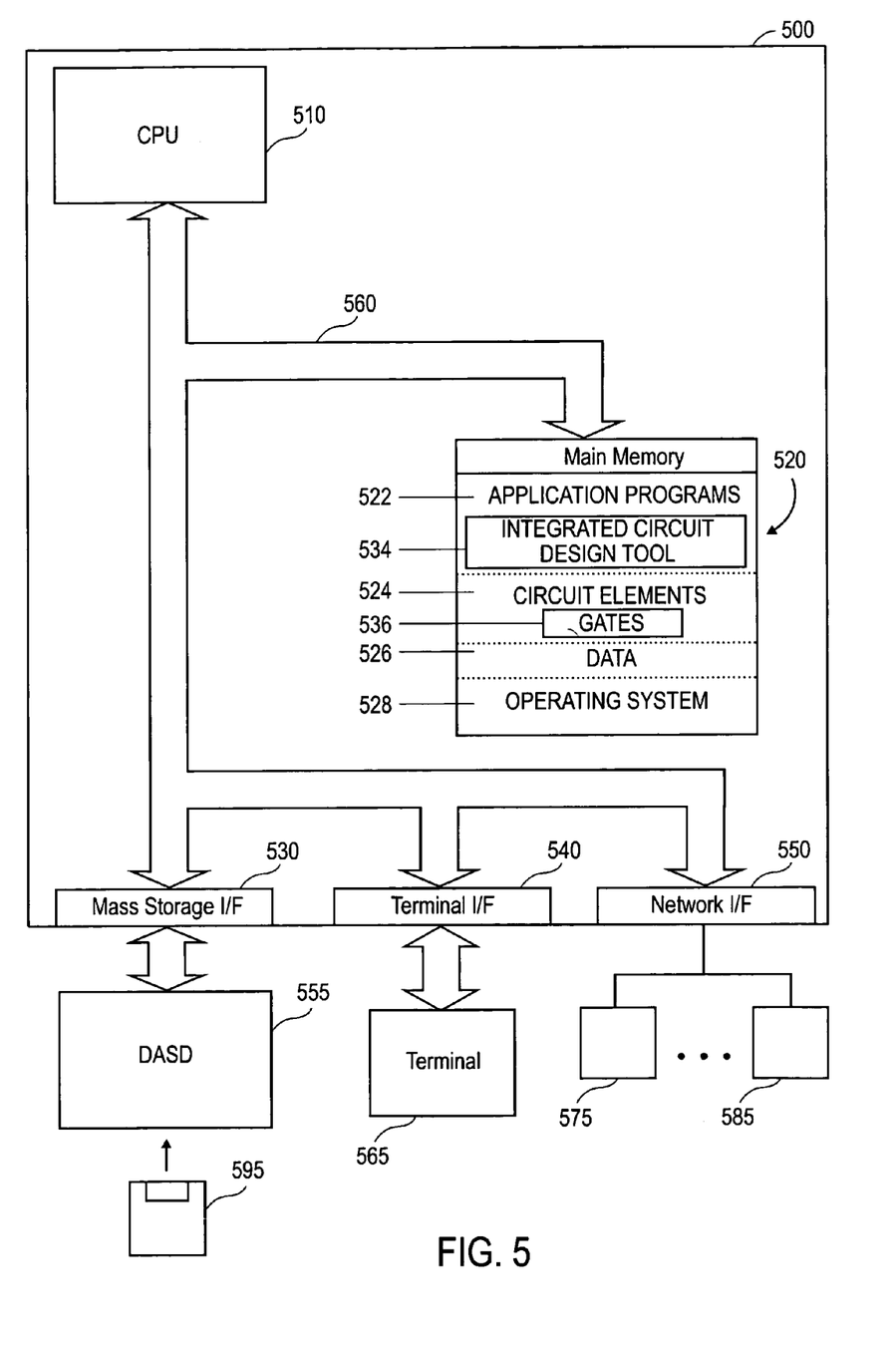
FIG. 5 is a block diagram of one embodiment of the computer system.

FIG. 5 is a block diagram of the computer system that may be used to perform one or more functions described above. The mechanisms and apparatus of the present invention apply equally to any computer system, regardless of whether the computer system is a complicated multi-user computing apparatus or a single user workstation.

As shown in the exploded view of FIG. 5, computer system 500 comprises a main or central processing unit (CPU) 510 coupled to a main memory 520, a mass storage interface 530, a terminal interface 540, and a network interface 550. These system components are interconnected through the use of a system bus 560. Mass storage interface 530 is used to connect mass storage devices (such as device 555) to computer system 500. Device 555 may comprise a floppy disk drive, which may store data to and read data from a floppy diskette 595.

Main memory 520 contains one or more application programs 522, circuit elements 524, data 526, and an operating system 528. Computer system 500 utilizes well known virtual addressing mechanisms that allow the programs of computer system 500 to behave as if they only have access to a large, single storage entity instead of access to multiple, smaller storage entities such as main memory 520 and DASD device 555. Therefore, while application programs 522, circuit elements 524, data 526, and operating system 528 are shown to reside in main memory 520, those skilled in the art will recognize that these are not necessarily all completely contained in main memory 520 at the same time. (It should also be noted that the term "computer system memory" is used herein to generically refer to the entire virtual memory of computer system 500.)

Operating system 528 is a suitable multitasking operating system. Those skilled in the art will appreciate that the spirit and scope of the present invention is not limited to any one operating system. Also residing in main memory 520 are one or more application programs 522 that are executed by CPU 510. One of these application programs is an integrated circuit design tool 534 in accordance with the present invention. Also included within main memory 520 are representations (e.g., electrical and timing parameters) of circuit elements 524 that are used by design tool 534. One example of a suitable circuit element is a gate 536 as shown. While integrated circuit design tool 534 and circuit elements 524 are shown residing in main memory 520, they may exist anywhere in the virtual memory space of computer 800. In addition, while circuit elements 524 are shown separate from design tool 534, these circuit elements 524 could also be provided as an integral part of integrated circuit design tool 534.

Although computer system 500 is shown to contain only a single main CPU and a single system bus, those skilled in the art will appreciate that the present invention may be practiced using a computer system that has multiple CPUs and/or multiple buses. In addition, the interfaces that are used in one embodiment each include separate, fully programmed microprocessors that are used to off-load compute-intensive processing from CPU 510. However, those skilled in the art will appreciate that the present invention applies equally to computer systems that simply use I/O adapters to perform similar functions.

Terminal interface 540 is used to directly connect one or more terminals 565 to computer system 500. These terminals 565, which may be non-intelligent or fully programmable workstations, are used to allow system administrators and users to communicate with computer system 500.

Network interface 550 is used to connect other computer systems and/or workstations (e.g., 575 and 585 in FIG. 5) to computer system 500 in networked fashion. The present invention applies regardless of whether network interface 550 is present or not. For the purposes of one embodiment herein, network interface 550 is present, and the present invention applies equally no matter how computer system 500 may be connected to other computer systems and/or workstations, regardless of whether the connection(s) is made using present-day analog and/or digital techniques or via some networking mechanism of the future. It is also important to point out that the presence of network interface 550 within computer system 500 means that computer system 500 may engage in cooperative processing with one or more other computer systems or workstations. Of course, this in turn means that the programs shown in main memory 520 need not necessarily all reside on computer system 500. For example, one or more programs of application programs 522 may reside on another system and engage in cooperative processing with one or more programs that reside on computer system 500. This cooperative processing could be accomplished through use of one of the well known client-server mechanisms such as remote procedure call (RPC).

Note that the present invention is capable of being distributed on any signal bearing media, such as a program via floppy disk (e.g., 595 of FIG. 5), CD ROM, or other form of recordable media, or via any type of electronic transmission mechanism.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

What is claimed is:

1. A method for identifying potential noise failures in an integrated circuit design comprising:

locating a victim net and an aggressor within the integrated circuit design;

modeling the victim net using two $\pi$-type resistor-capacitor (RC) circuits, wherein modeling the victim net using two $\pi$-type resistor-capacitor (RC) circuits comprises modeling the victim net with one $\pi$-type RC circuit before a coupling location and one $\pi$-type RC circuit after the coupling location;

determining a coupling between the victim net and the aggressor;

determining noise width using the model of the victim;

determining peak noise amplitude using the model of the victim net; and indicating that the integrated circuit design requires modification if the noise width or the peak noise amplitude indicates that a potential noise failure will occur in the integrated circuit design.

2. The method defined in claim 1 wherein the peak noise amplitude is determined according to:

$$(R_d+R_s)C_x/\{R_d(C_1+C_x+C_2+C_L)+R_s(C_x+C_2+C_L)+R_eC_L\}$$

where $R_d$ comprises the effective resistance of the victim driver, $R_s$ comprises the upstream wire resistance from the victim driver to the coupling center, $R_e$ is the downstream wire resistance from the coupling center to the receiver under noise consideration, $C_x$ is the coupling capacitance, $C_1$ is half of the upstream wiring capacitance from the coupling center to the driver, $C_2$ is half of the total wire capacitance on the path from the driver to the receiver, and $C_L$ is half of the total wire capacitance from the coupling center to the receiver, plus the receiver input capacitance.

3. The method defined in claim 1 wherein modeling the victim net comprises computing crosstalk noise at a sink with a lumped capacitance at each branch incorporated on a path from a source to the sink, with lumped capacitances being added in a weighted manner based on their locations on the path.

4. A method for identifying potential noise failures in an integrated circuit design comprising:

locating a victim net and an aggressor within the integrated circuit design;

modeling the victim net using two π-type resistor-capacitor (RC) circuits, wherein modeling the victim net using two π-type resistor-capacitor (RC) circuits comprises modeling the victim net with one π-type RC circuit before a coupling location and one π-type RC circuit after the coupling location;

determining a coupling between the victim net and the aggressor;

determining noise width, wherein the noise width is determined corresponding to:

$$t_r + t_v \ln[(1 - e_{rv}^{-2t/r})/(1 - e_{rv}^{-t/r})]$$

where $t_r$ comprises transition time and $t_v$ comprises a distributed Elmore delay of the victim net;

determining peak noise amplitude using the model of the victim net; and indicating that the integrated circuit design requires modification if the noise width or the peak noise amplitude indicates that a potential noise failure will occur in the integrated circuit design.

5. The method defined in claim 4 wherein the noise width is determined corresponding to:

$$t_v \ln[(t_x - t_r v_t)(e_{rv}^{t/t} - 1)/t_r v_t]$$

where $t_r$ comprises transition time, $t_v$ comprises distributed Elmore delay of the victim net, $t_x$ comprises the RC delay term from the upstream resistance of the coupling elements multiplied by the coupling capacitance, and $v_t$ comprises a threshold voltage.

6. The method defined in claim 5 wherein the threshold voltage is set to half of the peak noise voltage.

7. A method for identifying potential noise failures in an integrated circuit design comprising:

locating a victim net and an aggressor within the integrated circuit design;

modeling the victim net using two π-type resistor-capacitor (RC) circuits, wherein modeling the victim net using two π-type resistor-capacitor (RC) circuits comprises modeling the victim net with one π-type RC circuit before a coupling location and one π-type RC circuit after the coupling location;

determining a coupling between the victim net and the aggressor;

determining noise width, wherein the noise width is based on only transition time and distributed Elmore delay of the victim net;

determining peak noise amplitude using the model of the victim net; and indicating that the integrated circuit design requires modification if the noise width or the peak noise amplitude indicates that a potential noise failure will occur in the integrated circuit design.

8. A method for identifying potential noise failures in an integrated circuit design comprising:

locating a victim net and an aggressor within the integrated circuit design;

modeling the victim net using two π-type resistor-capacitor (RC) circuits, wherein modeling the victim net using two π-type resistor-capacitor (RC) circuits comprises modeling the victim net with one π-type RC circuit before a coupling location and one π-type RC circuit after the coupling location;

determining a coupling between the victim net and the aggressor;

determining noise width, wherein the noise width is independent of an RC delay term from upstream resistance of the coupling element times coupling capacitance of the coupling location;

determining peak noise amplitude using the model of the victim net; and indicating that the integrated circuit design requires modification if the noise width or the peak noise amplitude indicates that a potential noise failure will occur in the integrated circuit design.

9. An article of manufacture comprising one or more recordable medium having executable instructions stored thereon which, when executed by a system, cause the system to:

locate a victim net and an aggressor within the integrated circuit design;

model the victim net using two π-type resistor-capacitor (RC) circuits, wherein modeling the victim net using two π-type resistor-capacitor (RC) circuits comprises modeling the victim net with one π-type RC circuit before a coupling location and one π-type RC circuit after the coupling location;

determine a coupling between the victim net and the aggressor;

determine noise width using the model of the victim;

determine peak noise amplitude using the model of the victim net; and indicate that the integrated circuit design requires modification if the noise width or the peak noise amplitude indicates that a potential noise failure will occur in the integrated circuit design.

10. The article of manufacture defined in claim 9 wherein the peak noise amplitude is determined according to:

$$(R_d + R_s)C_x / \{R_d(_1C_x + C_2 + C_L) + R_s(C_x + C_2 + C_L) + R_e C_L\}$$

where $R_d$ comprises the effective resistance of the victim driver, $R_s$ comprises the upstream wire resistance from the victim driver to the coupling center, $R_e$ is the downstream wire resistance from the coupling center to the receiver under noise consideration, $C_x$ is the coupling capacitance, $C_1$ is half of the upstream wiring capacitance from the coupling center to the driver, $C_2$ is half of the total wire capacitance on the path from the driver to the receiver, and $C_L$ is half of the total wire capacitance from the coupling center to the receiver, plus the receiver input capacitance.

11. The article of manufacture defined in claim 9 wherein instructions to model the victim net comprise instructions to compute crosstalk noise at a sink with a lumped capacitance at each branch incorporated on a path from a source to the sink, with lumped capacitances being added in a weighted manner based on their locations on the path.

12. An article of manufacture comprising one or more recordable medium having executable instructions stored thereon which, when executed by a system, cause the system to:
  locate a victim net and an aggressor within the integrated circuit design;
  model the victim net using two π-type resistor-capacitor (RC) circuits, wherein modeling the victim net using two π-type resistor-capacitor (RC) circuits comprises modeling the victim net with one π-type RC circuit before a coupling location and one π-type RC circuit after the coupling location;
  determine a coupling between the victim net and the aggressor;
  determine noise width, wherein the noise width is determined corresponding to:

$$t_r + t_v \ln[(1-e_{rv}^{-2t/t})/(1-e_{rv}^{-t/t})]$$

where $t_r$ comprises transition time and $t_v$ comprises a distributed Elmore delay of the victim net;
  determine peak noise amplitude using the model of the victim net; and
  indicate that the integrated circuit design requires modification if the noise width or the peak noise amplitude indicates that a potential noise failure will occur in the integrated circuit design.

13. The article of manufacture defined in claim 12 wherein the noise width is determined corresponding to:

$$t_v \ln[(t_x - t_r v_t)(e_{rv}^{t/t} - 1)/t_r v_t]$$

where $t_r$ comprises transition time, $t_v$ comprises distributed Elmore delay of the victim net, $t_x$ comprises the RC delay term from the upstream resistance of the coupling elements multiplied by the coupling capacitance, and $v_t$ comprises a threshold voltage.

14. The article of manufacture defined in claim 13 wherein the threshold voltage is set to half of the peak noise voltage.

15. An article of manufacture comprising one or more recordable medium having executable instructions stored thereon which, when executed by a system, cause the system to:
  locate a victim net and an aggressor within the integrated circuit design;
  model the victim net using two π-type resistor-capacitor (RC) circuits, wherein modeling the victim net using two π-type resistor-capacitor (RC) circuits comprises modeling the victim net with one π-type RC circuit before a coupling location and one π-type RC circuit after the coupling location;
  determine a coupling between the victim net and the aggressor;
  determine noise width, wherein the noise width is based on only transition time and distributed Elmore delay of the victim net;
  determine peak noise amplitude using the model of the victim net; and
  indicate that the integrated circuit design requires modification if the noise width or the peak noise amplitude indicates that a potential noise failure will occur in the integrated circuit design.

16. An article of manufacture comprising one or more recordable medium having executable instructions stored thereon which, when executed by a system, cause the system to:
  locate a victim net and an aggressor within the integrated circuit design;
  model the victim net using two π-type resistor-capacitor (RC) circuits, wherein modeling the victim net using two π-type resistor-capacitor (RC) circuits comprises modeling the victim net with one π-type RC circuit before a coupling location and one π-type RC circuit after the coupling location;
  determine a coupling between the victim net and the aggressor;
  determine noise width, wherein the noise width is independent of an RC delay term from upstream resistance of the coupling element times coupling capacitance of the coupling location;
  determine peak noise amplitude using the model of the victim net; and
  indicate that the integrated circuit design requires modification if the noise width or the peak noise amplitude indicates that a potential noise failure will occur in the integrated circuit design.

* * * * *